(12) United States Patent
Murakami et al.

(10) Patent No.: US 12,381,345 B2
(45) Date of Patent: Aug. 5, 2025

(54) BRACKET FOR PRINTED CIRCUIT BOARD ASSEMBLY

(71) Applicant: HEWLETT PACKARD ENTERPRISE DEVELOPMENT LP, Houston, TX (US)

(72) Inventors: Vance Brey Murakami, Los Gatos, CA (US); Paul Wesley Stelter, San Bruno, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 288 days.

(21) Appl. No.: 17/896,457

(22) Filed: Aug. 26, 2022

(65) Prior Publication Data

US 2024/0072469 A1 Feb. 29, 2024

(51) Int. Cl.
*H01R 12/73* (2011.01)
*H01R 12/70* (2011.01)
*H05K 1/14* (2006.01)

(52) U.S. Cl.
CPC ....... *H01R 12/732* (2013.01); *H01R 12/7082* (2013.01); *H05K 1/144* (2013.01)

(58) Field of Classification Search
CPC .. H01R 12/732; H01R 12/7082; H01R 12/73; H05K 3/366; H05K 2201/042; H05K 2201/10189; H05K 7/142; H05K 1/144; H05K 7/1402; H05K 7/1424; H05K 7/18
See application file for complete search history.

(56) References Cited

U.S. PATENT DOCUMENTS

| | | | |
|---|---|---|---|
| 6,804,112 B2 | 10/2004 | Klimke et al. | |
| 2013/0271905 A1* | 10/2013 | Sullivan | G06F 1/1607 361/679.02 |
| 2015/0137915 A1* | 5/2015 | Mills | H01H 9/28 200/43.11 |
| 2020/0067229 A1* | 2/2020 | Tsorng | H05K 7/1492 |

OTHER PUBLICATIONS

AVT Wiring & Connecting, "PCB Edge Spacer (02)," Part No. 28003461, available online at <https://avt-connecting.com/products/pcb-accessories/plastic-pcb-spacers/pcb-edge-spacers/11671.>, online May 17, 2022, 1 page.
Fastpoint SRL, "Edge Holding P.C.B. Spacer," Technical Description, available online at <https://www.fastpointweb.it/en/product/edge-holding-p-c-b-spacer/>, May 17, 2022, 2 pages.
Kang Yang Europe B.V., "Edge Hold Self Adhesive," Part No. ULCK-6.4, 2020, 4 pages.

* cited by examiner

*Primary Examiner* — Michael C Zarroli
(74) *Attorney, Agent, or Firm* — Jones Robb PLLC

(57) ABSTRACT

A bracket for a printed circuit board assembly (PCA) may comprise a first portion configured to be coupled to a first face of a first printed circuit board (PCB) and a second portion configured to be coupled to a first face of a second PCB. In an assembled state of the PCA, the first and second PCBs are in a stacked arrangement with the respective first faces thereof facing in a first direction. Moreover, in the assembled state, the bracket controls a distance between the respective first faces of the first and second PCBs along the first direction independent of respective thicknesses of the first and second PCBs along the first direction.

20 Claims, 7 Drawing Sheets

BRACKET FOR PRINTED CIRCUIT BOARD ASSEMBLY

INTRODUCTION

Some electronic systems (such as computers, networking devices, power equipment, and other electronic systems) comprise one or more smaller electronic devices (such as server blades, network adapters, PCIe cards, Solid State Drives (SSD), hard disk drives, power supplies, and other electronic devices) that are installed within the system. In some cases, the electronic device(s) may be capable of being selectively added to or removed from the system, for example by removably plugging an electronic device into or unplugging the electronic device from a bay or receptacle of the system. When installed in the system, the electronic devices may be housed within a system chassis of the system (the electronic devices may also have their own individual chassis, which may be received within the system chassis), and may be communicably (e.g., electrically, optically, etc.) connected with the system and/or with one another. For example, the electronic system may comprise electrical connectors configured to electrically connect with complementary electrical connectors of the electronic devices when those electronic devices are in an installed position in the system. The electronic devices may comprise one or more printed circuit boards (PCBs), and the connector(s) of the electronic devices may be coupled to the PCB(s). Similarly, the system may also comprise one or more PCBs or other circuitry housed within the system chassis, and the connectors of the system may be coupled to such a system PCB. These system PCBs or other circuitry may allow for communication of electrical and/or other signals between the various devices making up the system.

In some cases, when the electronic devices are added to the system, the respective connectors of the electronic devices and the system may not be visible to the user, and thus the system and the electronic devices may be configured to facilitate the mating of the connectors without relying on vision thereof, also referred to as blind mating. For example, the connectors of the system may be positioned at predetermined locations and the system chassis may be provided with guide structures that engage an electronic device as it is inserted into the system chassis to guide the electronic device into another predetermined location where its connector is aligned with the system connector.

BRIEF DESCRIPTION OF THE DRAWINGS

The present disclosure can be understood from the following detailed description, either alone or together with the accompanying drawings. The drawings and related description of the figures are included to provide a further understanding of the present disclosure and are incorporated in and constitute a part of this specification. The drawings illustrate one or more nonlimiting aspects and implementations of the present teachings and together with the description explain certain principles and operation. In the drawings.

DETAILED DESCRIPTION

Figure 1:
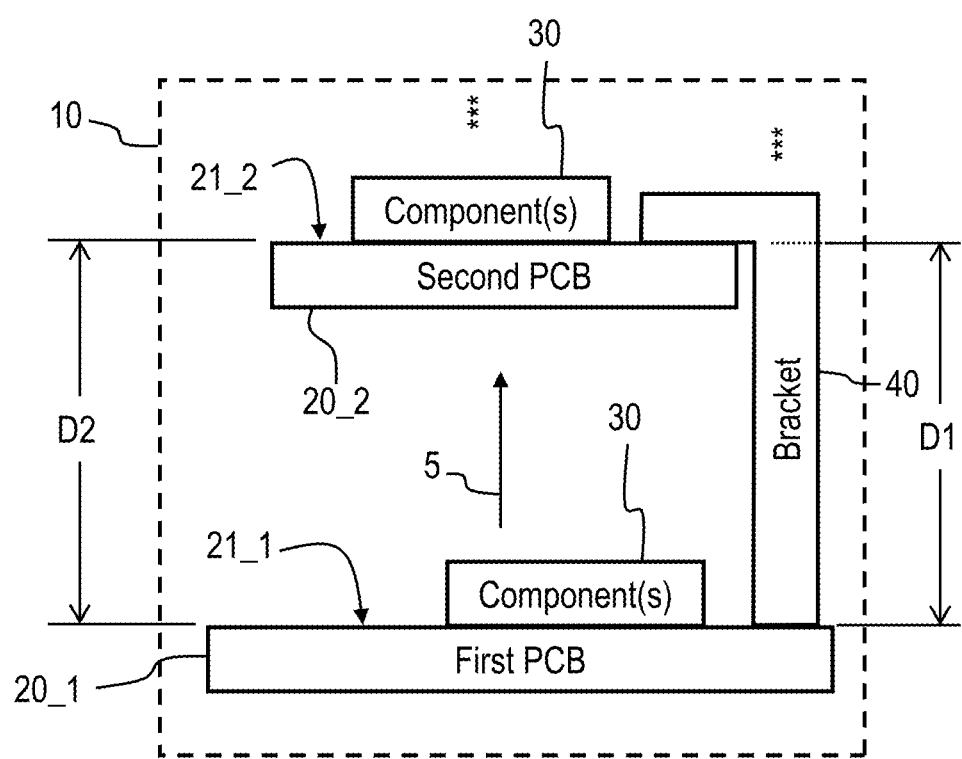
FIG. 1 is a block diagram illustrating a printed circuit assembly (PCA).

Some electronic devices may comprise multiple distinct PCBs which are coupled together, forming what is referred to as a printed circuit board assembly or printed circuit assembly (PCA). Some such PCAs comprise two or more PCBs arranged in a stacked configuration, meaning a configuration in which the faces of the PCBs are approximately parallel to one another and the PCBs at least partially overlap one another in a direction perpendicular to the faces. Herein, "faces" refers to the two opposing surfaces of the PCB with the largest area, which includes the surface(s) upon which printed circuits and/or components are disposed. This is in contrast to "edges" of the PCB which are the surfaces with smaller area that extend between the faces. For ease of description, the direction perpendicular to the faces of the PCBs is referred to herein as "vertical," but it should be understood that such references to "vertical" do not limit the orientation of devices relative to external reference frames. A PCA with PCBs arranged in the aforementioned stacked configuration may be referred to herein as a stacked PCA. Some stacked PCAs comprise connectors that are configured to couple with corresponding system connectors of a system PCB, and in some cases these connectors are disposed on different ones of the PCBs of the stacked PCA. Consequently, in such PCAs the connectors are vertically spaced apart from one another. The faces of the PCBs upon which these connectors are disposed may be referred to herein as the "first face" of the PCB and the face opposite therefrom may be referred to as the "second face". In some stacked PCAs, the PCBs are coupled together such that the first face of each PCB faces in the same direction.

An electronic device may utilize a stacked PCA for a variety of reasons. For example, a stacked PCA may allow for more flexibility in how space within a device chassis or system chassis is allocated, for example by allowing one of more of the PCBs to occupy space above another PCB that might otherwise have been vacant. As another example, the stacked PCA may allow the electronic device to have vertically spaced apart connectors (e.g., connectors may be disposed on different ones of the stacked PCBs), and this may be useful for coupling with corresponding vertically spaced connectors of a system PCB. In contrast, an electronic device with a single PCB may be more limited in where its connectors can be located, and thus such devices might not be able to connect to multiple vertically spaced connectors of the system PCB. The ability of an electronic device with a stacked PCA to connect to vertically spaced connectors of a system PCB can allow for greater flexibility in where connectors can be disposed on the system PCB. As another example, the stacked PCA can also allow an electronic device to be used with a system PCB that was originally designed for a different type of electronic device. For example, a system PCB configured to connect to two 1U devices stacked vertically atop one another may have two connectors at vertically spaced locations corresponding to each of the 1U devices ("U" refers to a standard rack unit, which would be familiar to those of ordinary skill in the art). However, a 2U electronic device provided with a stacked PCA could also connect to that very same PCB in lieu of the two 1U devices by locating the PCBs of the stacked PCA at locations that align with the system connectors. Thus, a system PCB that was originally designed for use in a system that receives two 1U devices may be repurposed for use in a different system that receives one 2U device by virtue of that 2U device using a stacked PCA.

However, when a stacked PCA is used, it can be challenging to control the vertical positions of the connectors disposed on the PCA with a high degree of precision. In particular, in applications where it is desired to connect the stacked PCA to vertically spaced connectors of a system, variation in the vertical positions of the PCA connectors may make it difficult to ensure that the connectors of the PCA are vertically aligned with the corresponding connectors of the system PCB. Such variation in the vertical positions of the PCA connectors may occur, for example, because of variation in dimensions of the parts of the PCA due to manufacturing tolerances, in particular due to variation in the respective thicknesses of the PCBs, as will be described in greater detail below.

Generally speaking, it is relatively easy to control the vertical position of the first face of one PCB—such as a bottom PCB of a stacked PCA—relative to the system chassis with adequate precision. For example, in the case of a removable electronic device, guide structures of the system chassis can direct the device chassis into a known position relative to the system chassis as the electronic device is inserted into the system chassis. In addition, one face of one of the PCBs may be fixed relative to the device chassis, and therefore the location of that face of the PCB relative to the device chassis can be known with high precision. Because the location of the face of the PCB is known relative to the device chassis and the location of the device chassis relative to the system chassis can be controlled by the guide structures, the location of the face of the PCB can be controlled relative to the system chassis. As another example, in the case of an electronic device that is permanently installed in the system chassis, a face of one of the PCBs of the PCA may be permanently fixed to the system chassis and thus a location of the face of the PCB relative to the system chassis is easily controlled. However, the vertical locations of the other PCB(s) of the PCA relative to the fixed PCB are not so easily controlled and may vary depending on the manufacturing tolerances of various parts of the PCA, including the thicknesses of the PCBs.

For example, in some stacked PCAs the PCBs are oriented with their respective first faces facing in the same direction as one another and these PCBs are connected to one another by columnar coupling members, such as coupling nuts, situated between adjacent PCBs. These coupling members may be connected to the respective faces of the two adjacent PCBs that are facing one another, i.e., to the first face of one PCB (e.g., a top face of a lower PCB) and to the second face of the other PCB (e.g., a bottom face of an upper PCB). With such an arrangement, the relative vertical positions (i.e., the vertical separation between) the respective first faces of the two PCBs will depend on the dimensions of the coupling member and on the thicknesses of the PCBs—for example, the distance from the first face of a lower PCB to the first face of an upper PCB will be the sum of the length of the coupling member coupled thereto and the thickness of the upper PCB (assuming flush contact of the coupling member with the two PCBs). It can be difficult to control the thicknesses of the PCBs with precision due to how PCBs are manufactured, and therefore the relative vertical positions of the first faces of the PCBs will have some variance (tolerance) at least in part due to variation in the PCB thickness. Because even slight variation in the vertical locations of the connectors on the stacked PCBs may inhibit the mating of those connectors with the corresponding connectors of the system PCB in some systems, the variation in PCB thickness can be enough by itself to prevent the mating. For example, in some circumstances a range in variation in PCB thickness is often on the order of around 10% of the board thickness per PCB, and in some cases can be on the order of ±0.5 mm per PCB. Furthermore, stacked PCAs that have many PCBs (e.g., three, four, or more PCBs) will have even greater variance in connector location as the individual tolerances for PCB thickness stack.

To address these and other issues, examples disclosed herein utilize one or more brackets to couple two or more PCBs together in a stacked configuration (thus forming a stacked PCA), with each bracket precisely controlling the vertical positions of the first faces of the PCBs relative to the bracket and relative to one another regardless of variation in thicknesses of the PCBs. More specifically, the bracket is configured to couple with the PCBs such that the separation distance between the respective first faces of each pair of adjacent PCBs is controlled entirely by dimensions of the bracket, with the thicknesses of the PCBs not contributing at all to the separation distance (i.e., the separation distance between the adjacent first faces is independent of PCB thickness). Because the connectors are coupled to the first faces, by precisely controlling the relative vertical locations of the first faces, the relative vertical locations of the connectors are also controlled. Thus, the variation in thickness of the PCBs is removed entirely from the tolerance stack in relation to vertical locations of the connectors, and the tolerances of the bracket remain as the predominant contributors to variation in vertical locations of the connectors. The tolerances of the bracket can be made very small, i.e., the relevant dimensions of the bracket can be controlled with high precision, and therefore the overall variation in vertical locations of the connectors can be made very small. Thus, the brackets disclosed herein can be used to precisely control the vertical locations of the PCA connectors and thereby facilitate mating of the PCA connectors with the corresponding system connectors.

In some examples, the above-described control over the vertical locations of the first faces is accomplished at least in part by the brackets coupling directly to the respective first faces of the PCBs of the PCA at known and fixed locations on the brackets. For example, an example bracket may have a first portion with a first engagement surface that couples with and contacts the first face of the first PCB and a second portion with a second engagement surface that couples with and contacts the first face of the second PCB. The first and second portions may be coupled together by an intermediate portion extending in a vertical direction therebetween. The intermediate portion of the bracket may pass through a thickness dimension of the second PCB so that the first portion of the bracket is positioned on one side of the second PCB (the side that is closer to the first PCB) and the second portion of the bracket is positioned on an opposite side of the second PCB (the side that is further from the first PCB). The first and second engagement surfaces are oriented horizontally and parallel to the first faces and are held fixedly in contact with the first faces, and thus the contact between these engagement surfaces and the first faces precisely controls the vertical positions of the first faces relative to the bracket—i.e., one first face is fixed at the same vertical position as the first engagement surface, and the other first face is fixed at the same vertical position as the second engagement surface. Because the engagement surfaces control the positions of the first faces of the PCBs relative to the bracket, the vertical positions of the first faces relative to one another are entirely dependent on the separation distance between the engagement surfaces of the bracket, and consequently the vertical positions of the first faces relative to one another are independent of the respective thicknesses of either of the PCBs. Thus, by precisely controlling the separation distance between the engagement surfaces of the bracket, the vertical locations of the first faces of the first and second PCBs can be precisely controlled. It can be relatively easy to precisely control the separation distance between the engagement surfaces of the bracket using existing fabrication techniques, and thus using the example brackets described herein the vertical locations of the first faces, and the connectors disposed thereon, can be controlled with precision.

It may be noted that with the arrangement described above, variation in the thicknesses of the PCBs may still affect the relative vertical locations of the second faces of the PCBs relative to one another and/or relative to the first faces. However, in some circumstances, the vertical locations of the second faces of the PCB may be of less significance because the first faces of the PCBs are the ones upon which the connectors of the PCAs are disposed. In other words, potential variations in the vertical locations of the second faces of the PCBs due to variation in PCB thickness may be irrelevant when it comes to ensuring alignment and mating of the connectors.

Turning now to the figures, various devices, systems, and methods in accordance with nonlimiting aspects of the present disclosure will be described. In the following description, directional/relational terms such as bottom, top, above, below, up, and down and the like are used to aid understanding, but these terms are used only in relation to the orientations and arrangements depicted in the figures and are not intended to imply anything about the locations or orientations of the parts in other contexts, such as relative to an external reference frame. Thus, for example, a PCB that is illustrated in the figures and described herein as being above a second PCB may be positioned below the second PCB if the assembly is rotated 180 degrees from the illustrated orientation. In particular, the directional term "vertical" may be used herein relative to a stacked PCA (or relative to individual components thereof) to refer to directions that will be perpendicular to the faces of the PCBs of the stacked PCA in its assembled state. The term "vertical" may also be used herein relative to a system that is to receive such a PCA, and in this context refers to directions that would be perpendicular to the faces of the PCBs of the PCA in a state of the PCA being in an installed position in the system. By extension, "horizontal" is used herein to refer to any direction perpendicular to a vertical direction. References herein to vertical and horizontal do not imply anything regarding the orientations of components relative to other objects or reference frames, and thus, for example, a direction described as "vertical" herein could be horizontal relative to some other reference frame, such as the ground.

FIG. 1 is a block diagram conceptually illustrating a PCA 10. It should be understood that FIG. 1 is not intended to illustrate specific shapes, dimensions, or other structural details accurately or to scale, and that implementations of the PCA 10 may have different numbers and arrangements of the illustrated components and may also include other parts that are not illustrated.

The PCA 10 comprises two or more PCBs 20 arranged in a stacked configuration, meaning a configuration in which the faces of the PCBs 20 are approximately parallel to one another, and the PCBs 20 at least partially overlap one another in a vertical direction 5 perpendicular to the faces, as shown in FIG. 1. In FIG. 1, two PCBs 20 are illustrated for convenience—a first PCB 20_1 and a second PCB 20_2—but it should be understood that the PCA 10 may comprise any number of PCBs 20 equal to or greater than two. The PCA 10 also comprises a bracket 40, which couples the PCBs 20 together in the stacked configuration.

The PCBs 20 each comprise a first face 21. In particular, the first PCB 20_1 comprises a first face 21_1, the second PCB 20_2 comprises a first face 21_2, and so on. The first faces 21 comprise the faces of the PCBs 20 upon which one or more components 30 are disposed whose relative vertical locations it is desired to control. In some examples, such components 30 may include connectors that are configured to mate with complementary connectors of another device, such as a larger system into which the PCA 10 is to be installed, and thereby communicably connect the PCA 10 with the other device. In other examples, the components 30 could be sensors, optical transceivers, or any other components whose relative vertical location it may be desired to control. In the PCA 10, the respective first faces 21 of the PCBs 20 are all oriented facing in the same direction as one another, i.e., the vertical direction 5 illustrated in FIG. 1.

The bracket 40 is configured to couple with the first faces 21 of each of the PCBs 20 so as to precisely control the vertical positions of the first faces 21 of the PCBs 20 relative to the bracket 40 and relative to one another, regardless of variation in thicknesses of any of the PCBs 20 (thickness referring here to the dimensions of the PCBs 20 extending in the vertical direction 5). In other words, the bracket 40 controls the separation distances in the vertical direction 5 between the respective first faces 21 of the PCBs 20 independently of thicknesses of any of the PCBs 20. In particular, in the example shown in FIG. 1 in which there are two PCBs 20, the bracket 40 controls the vertical separation D2 between the first faces 21_1 and 21_2. In examples in which more than two PCBs 20 are present, the bracket 40 similarly controls the separation distances between the first faces 21 of the other PCBs 20 as well.

In some examples, the bracket 40 is configured to couple directly to the respective first faces 21 of the PCBs 20 (e.g., the first faces 21_1 and 21_2 in FIG. 1). In particular, in the orientation illustrated in FIG. 1 the vertical direction 5 points upward and thus the bracket 40 is coupled with the top (upward facing) sides of the stacked PCBs 20. Consequently, in the illustrated orientation, a portion of the bracket 40 is positioned below the second PCB 20_2 to couple with the first face 21_1 on the top side of the first PCB 20_1, whereas another portion of the bracket is positioned above the second PCB 20_2 to couple with the first face 21_2 on the top side of the second PCB_2. Similarly, if additional PCBs 20 (not illustrated) were included in the PCA 10, the bracket 40 would include additional portions (not illustrated) that would be positioned respectively above each of those additional PCBs 20 to connect to the respective first faces 21 on the top sides of the PCBs 20. The engagement between the bracket 40 and the first faces 21 controls the vertical locations of the first faces 21 relative to the bracket 40, and thus the bracket 40 controls the vertical separation distances between the PCBs 20 independently of the thickness of the PCBs 20. In particular, the vertical distances between the portions of the bracket 40 that engage the first faces 21, such as the distance D1 in FIG. 1, determines the vertical distances between the first faces 21, such as the distance D2 in FIG. 1. Thus, by precisely controlling the dimensions of the bracket 40, e.g., by precisely controlling the distance D1, the vertical locations of the first faces 21 can be controlled with precision.

The bracket 40 may be formed from a relatively rigid material, such as steel, aluminum, zinc, brass, or various plastics. For example, the bracket 40 may be formed by casting, molding, forging, and/or machining. With such manufacturing techniques, dimensions of the bracket can be relatively easily controlled with high precision.

The PCA 10 may be used as part of an electronic device, such as a computing device (e.g., an input-output module (IOM) of a data storage system, a server node, a blade of a blade server, or any other type of computing device), a network device (e.g., a switch, a router, or any other type of networking device), a power supply device, or any other type of electronic device. In some implementations, the PCA 10 is configured to be installed within a system, which may include being received within a system chassis of the system. In some implementations, the PCA 10 is configured to be removably installed within in a system chassis of a larger system—for example, the PCA 10 may be part of a pluggable module.

The PCA 10 is described above and illustrated in FIG. 1 in an assembled state to aid understanding. However, it should be understood that aspects of this disclosure also include the bracket 40 prior to being coupled to any PCBs 20 to form the PCA 10 (i.e., aspects of the disclosure include the bracket 40 by itself, wherein the bracket 40 is configured to be coupled with the PCBs 20 in the manner described above, but without the bracket 40 necessarily being so coupled).

Figure 2:
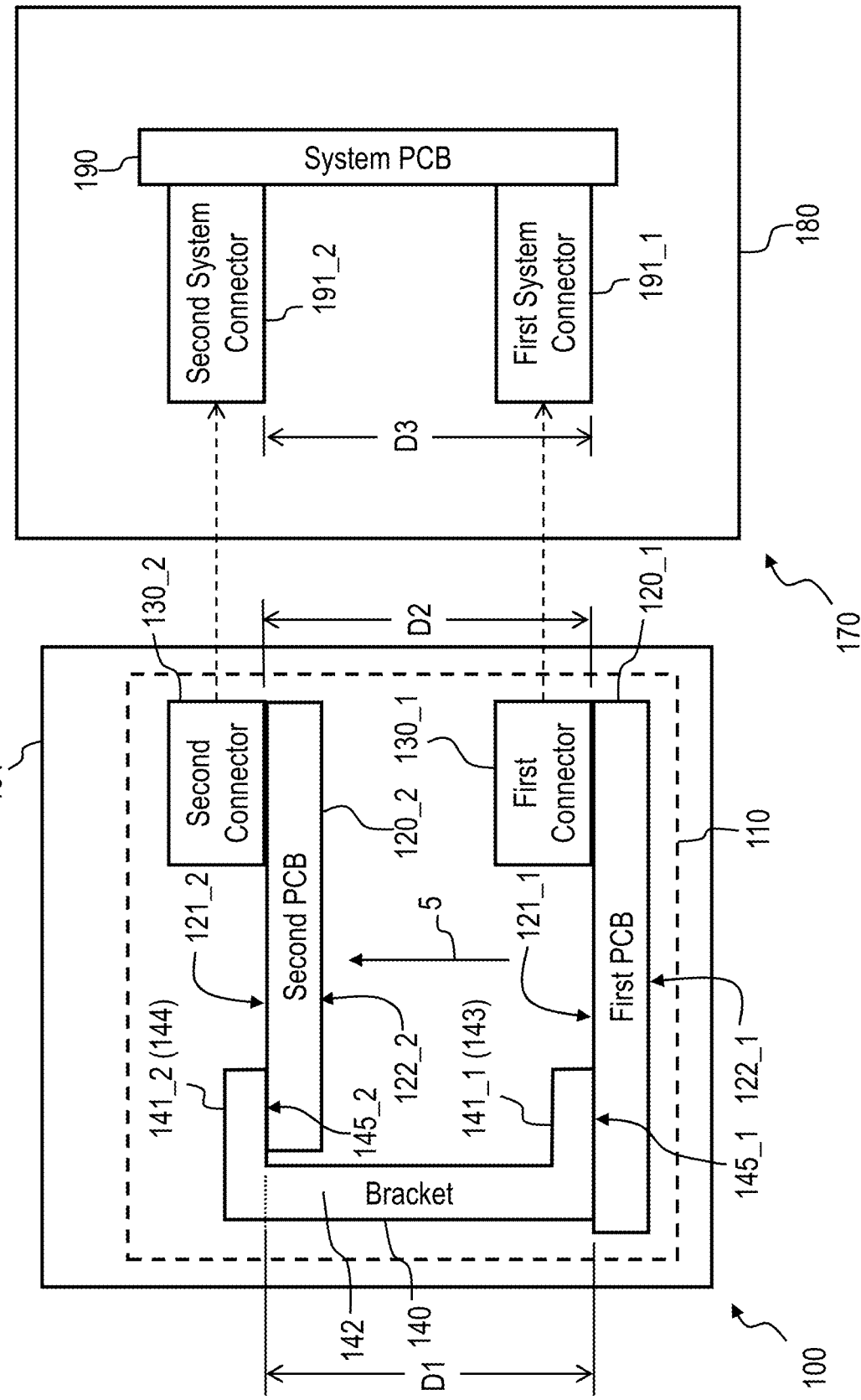
FIG. 2 is a block diagram illustrating an electronic device and a system.

FIG. 2 is a block diagram conceptually illustrating an electronic device 100 and a system 170. It should be understood that FIG. 2 is not intended to illustrate specific shapes, dimensions, or other structural details accurately or to scale, and that implementations of the electronic device 100 and system 170 may have different numbers and arrangements of the illustrated components and may also include other parts that are not illustrated.

As shown in FIG. 2, the electronic device 100 comprises a PCA 110. The PCA 110 is an example configuration of the PCA 10 described above. The electronic device 100 may also comprise a device chassis 101 that supports and/or houses the PCA 110. The chassis 101 comprises one or more support structures, such as walls, platforms, and other similar structures, that support and/or house various components of the electronic device 100. For example, the chassis 101 may comprise sheet metal walls that define a partially or fully enclosed housing. The electronic device 100 may comprise additional electronic components or other components (not illustrated). The electronic device 100 may be a computing device (e.g., an input-output module (IOM) of a data storage system, a server node, a blade of a blade server, or any other type of computing device), a network device (e.g., a switch, a router, or any other type of networking device), a power supply device, or any other type of electronic device.

The electronic device 100 is configured to be installed in the system 170, which comprises being received at least partially within a system chassis 180 of the system 170 and electrically coupled to the system 170. In FIG. 2, insertion of the electronic device 100 into the system chassis 180 is indicated by dashed arrows. In some examples, the electronic device 100 is removably installable in the system 170. In some examples, the electronic device 100 is hot-swappable, i.e., the electronic device 100 can be installed in or removed from the system 170 while the system 170 is powered on and operational. In some examples, the electronic device 100 is installable and removable from the system 170 without needing to open or otherwise disassemble the system chassis 180—for example, the electronic device 100 may be received into a receptacle or bay that is accessible from an exterior of the system chassis 180. The system 170 is indicated in FIG. 2 to aid understanding, but those having ordinary skill in the art would appreciate that aspects of the disclosure include the electronic device 100 by itself without the system 170 being present. Moreover, although the electronic device 100 and the system 170 are described separately herein for convenience, in some contexts, the electronic device 100 may be considered as being a part of the system 170—for example, when the electronic device 100 is installed in the system 170, the electronic device may be considered as having become a part of the system 170. The system 170 also comprises various electronic circuitry (which may include the electronic device 100 in some states), and thus the system 170 may also be referred to as an electronic device.

The PCA 110 comprises two or more PCBs 120 arranged in a stacked configuration, like the PCA 10 described above. In FIG. 2, two PCBs 120 are illustrated for convenience—a first PCB 120_1 and a second PCB 120_2—but it should be understood that the PCA 110 may comprise any number of PCBs 120 equal to or greater than two. The PCA 110 also comprises a bracket 140, which couples the PCBs 120 together in the stacked configuration. The bracket 140 is one example configuration of the bracket 40 described above.

The PCBs 120 each comprise a first face 121 and a second face 122, opposite from the first face 121. In particular, the first PCB 120_1 comprises a first face 121_1 and a second face 122_1, the second PCB 120_2 comprises a first face 121_2 and second face 122_2, and so on. The respective first faces 121 of the PCBs 120 are all oriented facing in the same direction as one another, i.e., the vertical direction 5 illustrated in FIG. 2. The first faces 121 each have a connector 130 disposed thereon (i.e., attached thereto), i.e., a first connector 130_1 for the first PCB 120_1, a second connector 130_2 for the second PCB 120_2, and so on. The connectors 130 may include electrical connectors (e.g., analog and/or digital electrical signaling connectors and/or electrical power transmission connectors), optical connectors (e.g., for an optical communications pathway), fluidic connectors (e.g., liquid couplings for a liquid cooling system), or any other connectors for establishing a communication path for electricity, light, information, fluid, or other transmissible media.

The connectors 130 are configured to mate with respectively corresponding complementary system connectors 191 of the system 170 when the electronic device 100 is installed in the system 170, as suggested by the dashed arrows in FIG. 2. This mating of the connectors 130 with the system connectors 191 communicably connects (e.g., electronically connects, optically connects, fluidically connects, and/or otherwise communicably connects) the PCA 110 to the system 170. In some implementations, the connectors 130 and the system connectors 191 are configured to blind mate with one another in response to the electronic device 100 being inserted into the system chassis 180 and moved to an installed position. The system chassis 180 may include guide structures (e.g., ramps, rails, slots, flanges, or other guide structures) that guide the chassis 101 of the electronic device 100 into a desired position relative to the system chassis 180 as the chassis 101 is moved to an installed position. Such guide structures are familiar to those of ordinary skill in the art, and thus are omitted from the illustrations to simplify the drawings. The system connectors 191 are vertically spaced relative to one another, i.e., there is a non-zero distance in the vertical direction 5 between adjacent system connectors 191, for example the separation distance D3 between the first system connector 191_1 and the second system connector 191_2 as illustrated in FIG. 2. In some examples, the system connectors 191 are oriented to allow for mating with the connectors 130 in response to motion of the electronic device 100 in a horizontal direction (a direction parallel to the first faces 121 of the PCBs 120) relative to the system chassis 180.

The bracket 140 is coupled to the first faces 121 of the PCBs 120, like the bracket 40 described above. In particular, the bracket 140 comprises at least two PCB connection portions 141 (at least one for each PCB 120 of the PCA 110), as well as one or more intermediate portions 142 each extending between a pair of adjacent PCB connection portions 141. The bracket 140 may also comprise a first end portion 143 and a second end portion 144. The first end portion 143 may comprise one of the PCB connection portions 141 located at one end of the bracket 140, while the second end portion 144 may comprise another one of the PCB connection portions 141 located at an opposite end of the bracket 140. In the example illustrated in FIG. 2, just two PCB connection portions 141 are shown, and thus the PCB connection portions 141_1 and 141_2 correspond to the first and second end portions 143 and 144, respectively. In examples in which more than two PCB connection portions 141 are present, additional PCB connection portions 141 may be disposed between the end portions 143 and 144, and additional intermediate portions 142 may be disposed between adjacent pairs of PCB connection portions 141.

As shown in FIG. 2, each PCB connection portion 141 is positioned above and is coupled to a top (upward facing) side of a corresponding PCB 120 (directional terms here being understood in relation to the orientation illustrated in FIG. 2 in which the vertical direction 5 points upward). As a result, the intermediate portion 142 extends through the thickness dimension of at least one of the PCBs 120. In particular, in the example illustrated in FIG. 2, the PCB connection portion 141_1 at the first end portion 143 is disposed below the second PCB 120_2 (to allow it to couple with the first face 121_1 on the top side of the first PCB 120_1), the PCB connection portion 141_2 at the second end portion 144 is disposed above the second PCB 120_2 (to allow it to couple with the first face 121_2 on the top side of the second PCB 120_2), and the intermediate portion extends through the thickness dimension of the second PCB 120_2. To allow the PCB connection portion 141_2 to be positioned over the first face 121_2, the PCB connection portion 141_2 may extend horizontally in at least one direction from the intermediate portion 142 of the bracket 140, as shown in FIG. 2. Some or all of the other PCB connection portions 141 may similarly extend horizontally in at least one direction from the intermediate portion 142. The intermediate portion 142 may be positioned outside a perimeter of the second PCB 1202 (e.g., the intermediate portion 142 may extend along an outer edge of the second PCB 120_2 as the intermediate portion 142 extends through the thickness dimension of the second PCB 120_2), or may be positioned inside a perimeter of the second PCB 120_2 (e.g., the intermediate portion 142 may extend through an aperture in the PCB 120_2 as the intermediate portion 142 extends through the thickness dimension of second PCB 120_2).

As shown in FIG. 2, each PCB connection portion 141 includes an engagement surface 145, which is oriented horizontally and parallel to and facing the first face 121 of one of the PCBs 120. Specifically, in the example of FIG. 2, the engagement surface 145_1 of the PCB connection portion 141_1 (at the first end portion 143) faces and engages the first face 121_1 of the first PCB 120_1, and similarly the engagement surface 145_2 of the PCB connection portion 141_2 (at the second end portion 144) faces and engages the first face 121_2 of the first PCB 120_2. Each PCB connection portion 141 is fixedly coupled to its corresponding PCB 120, for example by a mechanical fastener (e.g., a screw), adhesive, welding, brazing (e.g., soldering), or any other fastening technique, and when the PCB connection portion 141 is so coupled to a PCB 120, the engagement surface 145 of the PCB connection portion 141 is held fixedly in engagement with the corresponding first face 121 of that PCB 120. Thus, the vertical location of the first face 121 relative to the bracket 140 is controlled entirely by the vertical location of the engagement surface 145 that is engaged therewith. Consequently, the vertical positions of the first faces 121 of adjacent PCBs 120 relative to the bracket 140 and relative to one another are controlled by the distance between the engagement surfaces 145 contacting the first faces, independently of the thickness of the PCBs 120. In particular, in the example of FIG. 2, the separation distance D2 between the first face 121_1 and the first face 121_2 is controlled by, and equal to, the vertical separation distance D1 between the engagement surfaces 145_1 and 145_2. The vertical separation between the first and second connectors 130_1 and 130_2 is also equal to the distance D2 between the first face 121_1 and the first face 121_2 because the first and second connectors 130_1 and 130_2 are disposed on the first and second faces 121_1 and 121_2.

Because the engagement surfaces 145_1 and 145_2 are fixed in contact with the first faces 121_1 and 121_2, by controlling the separation distance between the engagement surfaces 145_1 and 145_2 of the bracket 140 to be the same as the separation distance D3 between the system connectors 191_1 and 191_2, it can be ensured that the connectors 130_1 and 130_2 will be vertically separated from one another by the same distance that the system connectors 191_1 and 192_2 are vertically separated from one another; in other words it can be ensured that D2 equals D3. This can facilitate alignment and mating of the connectors 130_1 and 130_2 with the connectors 191_1 and 191_2. In particular, the vertical position of the first face 121_1 of the first PCB 120_1 can be controlled relative to the device chassis 101 by fixing the first face 121_1 to a known structure of known position in the chassis 101, and the position of the chassis 101 relative to the system chassis 180 can be controlled using guide structures as described already above. Thus the position of the first face 121_1 can be controlled relative to the system chassis 180 so as to align precisely with the first system connector 191_1. Once the first face 1211 is positioned in vertical alignment with the first system connector 191_1, the second connector 130_2 is automatically ensured to also be in vertical alignment with its corresponding system connector 191_2 because the second connector 130_2 is spaced from the first connector 130_1 by the same amount that the second system connector 191_2 is spaced from the first system connector 191_1. In examples in which more PCBs 120 and connectors 130 are present, the same mechanism as that described above also allows for automatic vertical alignment of the additional connectors 130 with their corresponding system connectors 191.

The bracket 140 may be formed from a relatively rigid material, such as steel, aluminum, zinc, brass, various plastics, or any other rigid material. For example, the bracket 140 may be formed by casting, molding, forging, and/or machining. With such manufacturing techniques, the distances between the engagement surfaces 145 of the bracket 140 can be relatively easily controlled with high precision.

Although only one bracket 140 is illustrated for ease of description, in practice multiple similar or identical brackets 140 could be used to connect the PCBs 120 together. For example, the brackets 140 could be disposed at intervals around the perimeter of the PCBs 120 to provide stable support for the PCBs 120. One or more brackets 140 may also be disposed at locations inside the perimeter of one or more PCBs 120 (e.g., extending through apertures in the PCBs 120).

As shown in FIG. 2, in some examples the system 170 may comprise a system PCB 190 and the system connectors 191 may be disposed on the system PCB 190. In particular, in some examples, the system connectors 191 are electrically connected with the system PCB 190, and when the connectors 130 are mated with their respectively corresponding systems connectors 191, this may establish communication paths between the PCBs 120 and the system PCB 190. In some examples, the system PCB 190 is oriented transverse to (e.g., perpendicular to) the PCBs 120 of the PCA 110 (i.e., the faces of the system PCB 190 are parallel to the vertical direction 5), and the system connectors 191 are coupled to the system PCB 190 at vertically spaced positions as illustrated in FIG. 2. In other examples, the system PCB 190 may be oriented horizontally and the system connectors 191 may be coupled at differing vertical locations to one or more support structures (not illustrated) that extend vertically from the system PCB 190.

The system chassis 180 can include one or more support structures such as walls, platforms, and other similar structures, that support and/or house various components of the system 170. For example, the system chassis 180 may comprise sheet metal walls that define a partially or fully enclosed housing. The system chassis 180 may optionally include one or more receptacles (not illustrated) for removably receiving electronic devices (including, in some examples, the electronic device 100).

The system PCB 190 is referred to herein as a "system" PCB to help distinguish it from the PCBs 120 of the electronic device 100, but otherwise this notation does not imply any limitations for the system PCB 190. In particular, the system PCB 190 may be, but does not have to be, a main board of the system 170. In some examples, the system PCB 190 is a midplane (aka center panel) of the system, which is a PCB that is positioned in an interior of the system chassis 180 near a middle portion thereof (between opposite ends of the system chassis 180) and configured to communicably connect with devices (such as the electronic device 100) that are inserted into receptacles in the system chassis 180. The system 170 may also comprise additional PCBs (not illustrated) and/or other circuitry (not illustrated) that is communicably connected with the system PCB 190. For example, the system 170 may include a main board (not illustrated) which includes circuitry (e.g., a baseboard management controller (BMC)) that controls aspects of the system 170 as a whole and which may be communicably coupled with the system PCB 190. The system 170 may also include, or be configured to receive, additional electronic devices (in addition to the electronic device 100), which may be installed within the system chassis 180. In some examples, the system PCB 190 is omitted and the system connectors 191 may be communicably connected to other components of the system 170 via communications conduits such as cables, wires, etc. Although the system connectors 191 are described above as separate parts, it should be understood that the system connectors 191 could be formed as two parts of a larger body, such as a single connector body comprising two or more groups of pins (or other connection members) that are vertically spaced from one another, each group configured to couple with one of the connectors 130.

Turning now to FIGS. 3-6, a bracket 240, a PCA 210, and a system 270, in accordance with various aspects of the disclosure will be described. The bracket 240 is one configuration of the brackets 40 and 140, the PCA 210 is one configuration of the PCAs 10 and 110, and the system 270 is one configuration of the system 170, and thus some components of the bracket 240, PCA 210, and system 270 are similar to components described above. The descriptions above are thus applicable to the similar components of the brackets 240, PCA 210, and/or system 270, and duplicative description of various aspects already described above may be omitted below. Similar components are referred to using the same last two digits, such as 241 and 141. Although the bracket 240, PCA 210, and system 270 are configurations of the brackets 40 and 140, the PCA 210, and the system 270, respectively, the brackets 40 and 140, PCAs 10 and 110, and system 170 are not limited to the bracket 240, PCA 210, or system 270, respectively.

Figure 3:
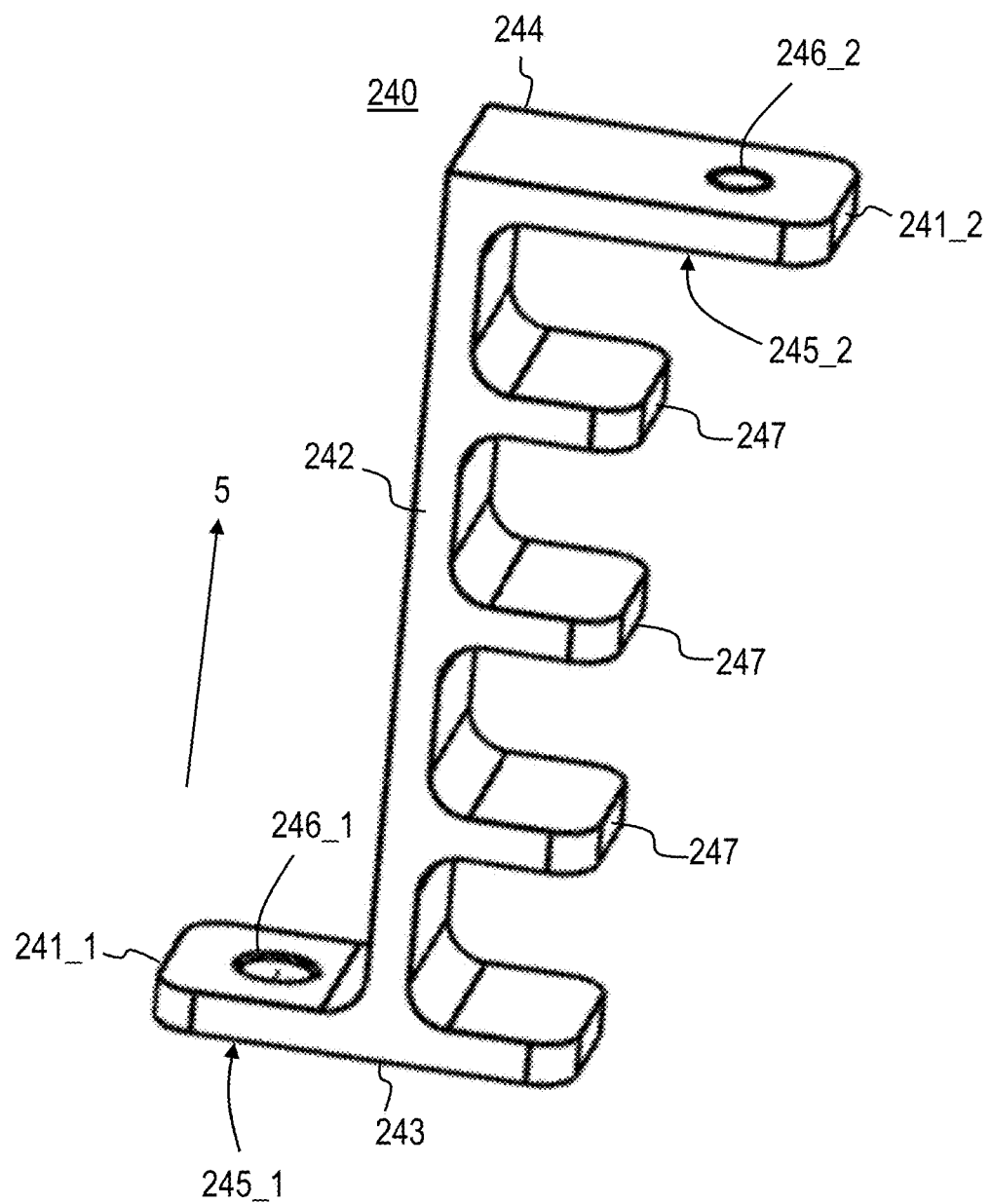
FIG. 3 is a perspective view of a bracket for a PCA.
Figure 4:
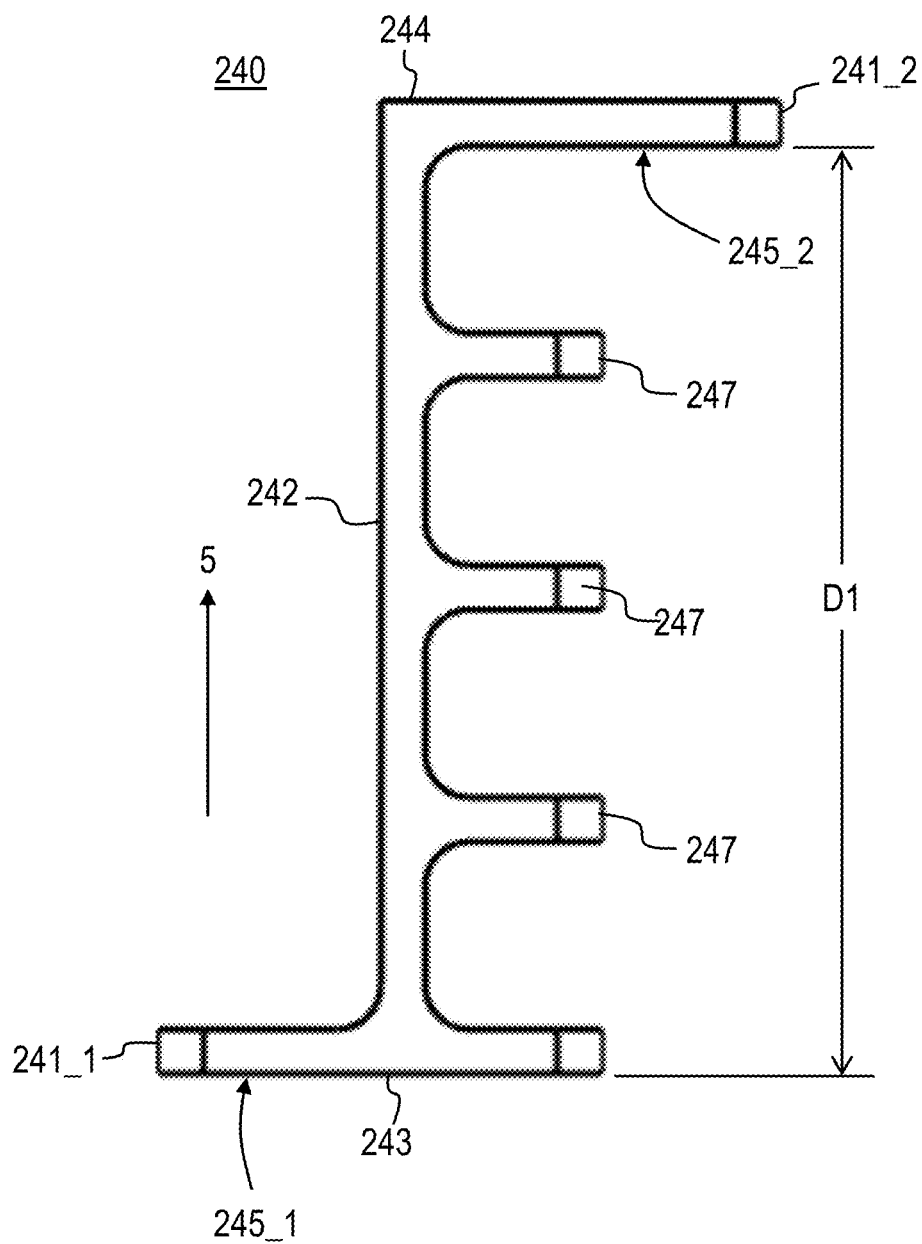
FIG. 4 is a side view of the bracket of FIG. 3.
Figure 5:
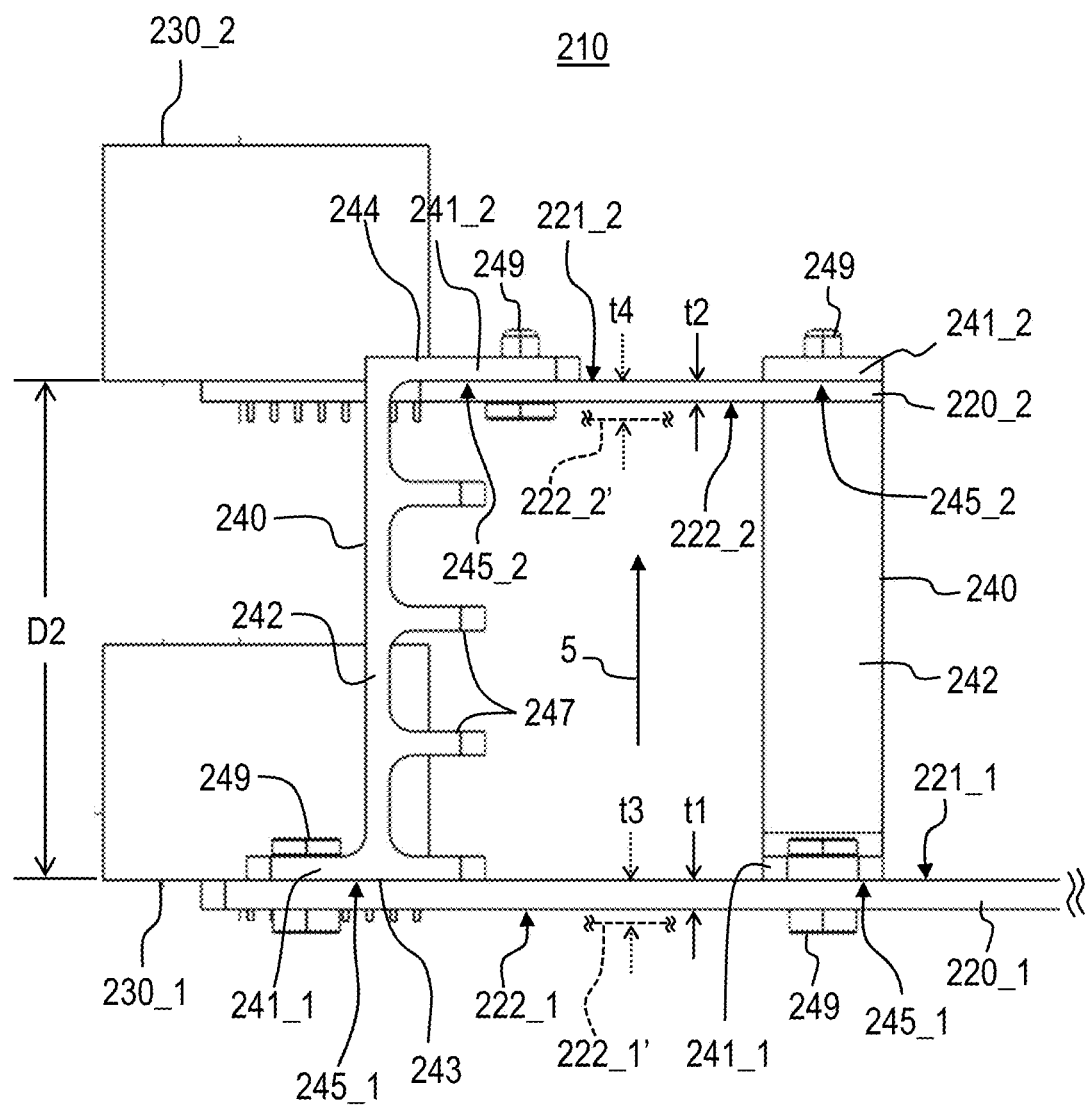
FIG. 5 is a side view of a PCA comprising the bracket of FIG. 3.
Figure 6:
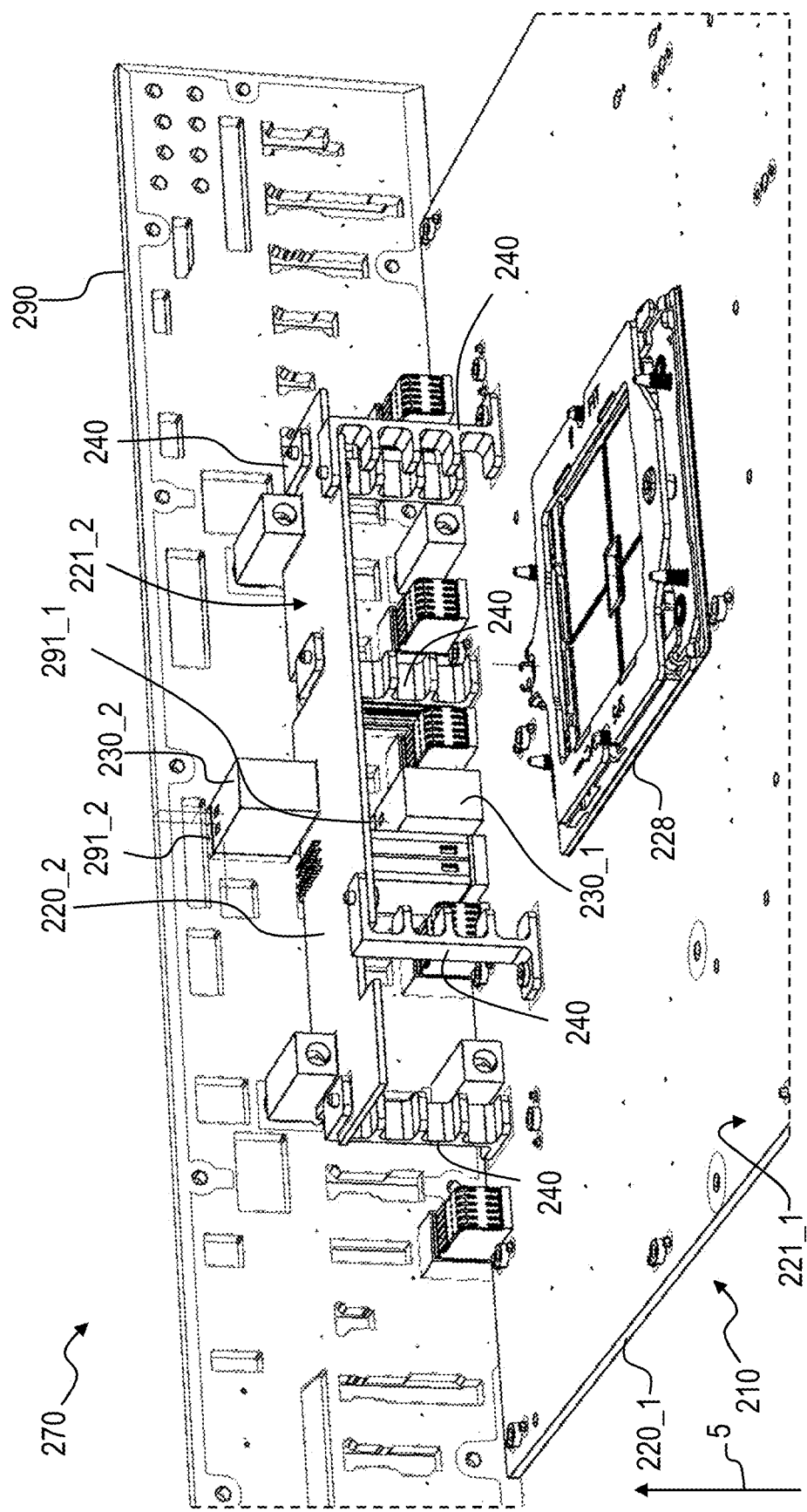
FIG. 6 is a perspective view of a PCA in an installed position in a system.

FIGS. 3 and 4 illustrate the bracket 240 by itself in state in which it is not coupled to any PCBs. FIGS. 5 and 6 illustrate the bracket 240 being used as part of the PCA 210 in an assembled state of the PCA 210 with the bracket 240 coupled to first and second PCBs 220_1 and 220_2 (described below) (certain components of the PCA 210 which are visible in FIG. 6 are hidden in FIG. 5 to allow better visibility of other components). Multiple instances of the bracket 240 may be used in the PCA 210, but the description below will mainly focus on a single bracket 240 for ease of description. Moreover, FIG. 6 illustrates the PCA 210 in an installed position within the system 270 with connectors 230 (described below) of the PCA 210 in a coupled state with system connectors 291 (described below) of the system 270. Various aspects described below are visible in multiple figures and the description below will refer to figures that are particularly relevant to various aspects as those aspects are described rather than describing the figures in strict sequence.

As shown in FIGS. 3 and 4, the bracket 240 comprises a first end portion 243, a second end portion 244, and an intermediate portion 242 extending along a vertical direction 5 between the first and second end portions 243 and 244. As shown in FIGS. 3 and 4 the first end portion 243 comprises a first PCB connection portion 241_1 configured to be affixed to a PCB positioned below the bracket 240 (e.g., the first PCB 220_1 shown in FIGS. 5 and 6). As shown in FIGS. 3 and 4, the first PCB connection portion 241_1 extends horizontally from the intermediate portion 242 and comprises a first engagement surface 245_1 that faces downward (in a direction opposite the vertical direction 5). The first engagement surface 245_1 is arranged to be parallel to and to make contact with an upward facing face of the PCB positioned below the bracket. For example, as shown in FIGS. 5 and 6, the first engagement surface 245_1 may contact the first face 221_1 of the first PCB 220_1. The affixing of the first PCB connection portion 241_1 to this first PCB holds the first engagement surface 245_1 fixedly in this state of contact with the upward facing face of the first PCB (e.g., the first face 221_1 in FIGS. 5 and 6). As shown in FIG. 3, the first PCB connection portion 241_1 may also comprise an aperture 246_1, through which a mechanical fastener (e.g., screw, rivet, etc.) may be inserted to affix the first PCB connection portion 241_1 to the PCB—for example, as shown in FIG. 5 a mechanical fastener 249 is inserted through the aperture 246_1 to affix the first PCB connection portion 241_1 to the first PCB 220_1.

As shown in FIGS. 3 and 4 the second end portion 244 comprises a second PCB connection portion 241_2 configured to be affixed to a second PCB positioned above the first PCB (e.g., to the PCB 220_2 shown in FIGS. 5 and 6). As shown in FIGS. 3 and 4, the second PCB connection portion 241_2 extends horizontally from the intermediate portion 242 and comprises a second engagement surface 245_2 that faces downward (in a direction opposite the vertical direction 5). The second engagement surface 245_2 is arranged to be parallel to and to make contact with an upward facing face of the second PCB. For example, as shown in FIGS. 5 and 6, the second engagement surface 245_2 contacts the first face 221_2 of the second PCB 220_2. The affixing of the second PCB connection portion 241_2 to the second PCB holds the second engagement surface 245_2 fixedly in this state of contact with the upward facing face of the second PCB (e.g., with the first face 221_1). As shown in FIG. 3, the second PCB connection portion 241_2 may also comprise an aperture 246_2, through which a mechanical fastener (e.g., screw, rivet, etc.) may be inserted to affix the second PCB connection portion 241_2 to the second PCB, such as the mechanical fastener 249 which affixes the second PCB connection portion 241_2 to the second PCB 220_2 in FIG. 5. The second engagement surface 245_2 is vertically separated from the first engagement surface 245_1 by a distance D1, as shown in FIG. 4.

As shown in FIGS. 3 and 4, the bracket 240 may also optionally comprise horizontal ribs 247. The horizontal ribs 247 comprise flanges or tabs that extend horizontally from the intermediate portion 242, as shown in FIG. 3. The horizontal ribs 247 may be generally planar in structure, meaning that they have length and breadth dimensions that are greater than a thickness dimension, where the thickness dimension extends in the vertical direction 5. The length and breadth dimensions may be arranged in a plane parallel to the horizontal direction (i.e., perpendicular to the vertical direction 5). The horizontal ribs 247 may increase the rigidity of the bracket 240 to help resist flexing of the intermediate portion 242. Such flexing may change the vertical positions of the PCBs coupled to the bracket 240, and thus avoiding such flexing may help to ensure that the PCBs remain located at their intended vertical positions. Three horizontal ribs 247 are illustrated in FIGS. 3-6, but in other examples more or fewer horizontal ribs 247 may be used, including no horizontal ribs 247 in some examples.

As mentioned above, the bracket 240 may be used to couple two PCBs 220_1 and 2202 together in a stacked configuration to form a PCA 210. The PCBs 220_1 and 220_2 comprise components the vertical spacing of which it is desired to control with precision, including connectors 230. In FIGS. 5 and 6 one connector 230 is labeled for each PCB 220, namely a first connector 230_1 for the first PCB 220_1 and a second connector 230_2 for the second PCB 2202, but it should be understood that each PCB 220 could include multiple connectors 230. Additional connectors or other components may also be present on the PCBs 220, but are not illustrated or labeled to simplify the illustration. As shown in FIGS. 5 and 6, multiple of the brackets 240 may be used to form the PCA 210. In the example of FIG. 6, five brackets 240 are used, but any number equal to or greater than one bracket 240 may be used. The more brackets 240 used, the greater the structural stability of the PCA 210. As shown in FIG. 6, the brackets 240 may be distributed around a perimeter of the second PCB 220_2. Notches or other openings may be formed in the perimeter of the second PCB 220_2 to facilitate coupling of the brackets 240. The brackets 240 may also extend through the second PCB 220_2 at locations inside of its perimeter for example via apertures in the PCB 220_2 (not illustrated).

As shown in FIG. 5, when the PCA 210 is assembled, the bracket 240 extends from a first face 221_1 of the first PCB 220_1 in the vertical direction 5 to the second PCB 220_2 and then continues to extend in the vertical direction through a thickness dimension of the second PCB 220_2 so that the second PCB connection portion 241_2 at the second end portion 244 of the bracket 240 is located above the second PCB 220_2 and coupled to the first face 221_2 on the top side of the second PCB 220_2. As a result of the engagement between the engagement surfaces 245_1 and 245_2 and the first faces 221_1 and 2212, the vertical separation D2 between the first faces 221_1 and 221_2 (see FIG. 5) is controlled to be equal to the vertical separation D1 between the engagement surfaces 245_1 and 245_2 (see FIG. 4). Thus, the vertical separation D2 between the first faces 221_1 and 221_2 is independent of the thickness of the PCBs 220_1 and 220_2, and consequently variation in the thickness of the PCBs 220_1 and 220_2 does not affect the vertical separation D2. For example, FIG. 5 illustrates a hypothetical variation in the thicknesses of the PCBs 220_1 or 220_2 from initial thicknesses of t1 and t2, respectively, to thicknesses of t3 and t4, respectively. As can be seen in FIG. 5, as the thicknesses of the PCBs 220_1 or 220_2 vary, the vertical locations of the second faces 222_1 or 222_2 change relative to the bracket 240 (the dashed lines labeled 222_1' and 222_2' indicate hypothetical locations of the second faces 222_1 or 222_2 associated with the thicknesses t3 and t4), but the first faces 221_1 and 221_2 remain at the same vertical location because they are fixed to the engagement surfaces 245_1 and 245_2. As noted above, in certain contexts the variation in vertical location of the second face 222_1 or 222_2 can be acceptable because these faces do not have any connectors 230 coupled thereto that need to mate with system connectors 291.

FIG. 6 illustrates the brackets 240 and PCA 210 in an installed position within an example system 270 and in a coupled state of the connectors 230 with system connectors 291 of the system 270. As shown in FIG. 6, the system PCB 290 is oriented transverse (e.g., perpendicular) to the PCBs 220_1 and 220_2 when the PCA 210 is in the installed position; in other words, the system PCB 290 is oriented with its faces parallel to the vertical direction 5. The system 270 may also comprise a system chassis, which is omitted from the illustration to allow visibility of other features, and the system PCB 290 may be coupled to and supported by the system chassis. The PCA 210 may be part of an electronic device, which may comprise a device chassis, which is also omitted from the illustration to allow visibility of other features, and the PCA 210 may be supported by and coupled to the device chassis. As shown in FIG. 6, the system PCB 290 comprises one or more first system connectors 291_1 and one or more second system connectors 291_2. The first system connectors 291_1 are arranged to mate with corresponding ones of the first connectors 230_1 of the PCA 210, whereas the second system connectors 291_2 are vertically spaced from the first system connectors 291_1 and configured to mate with corresponding ones of the second connectors 230_2 of the PCA 210. The PCA 210 may comprise additional electronic circuitry beyond the connectors 230, such as electronic circuitry 228 illustrated on the first PCB 220_1 in FIG. 6. The electronic circuitry 228 may include, for example, a processor, a memory device, a hardware accelerator, a power supply or regulation circuit, etc.

Figure 7:
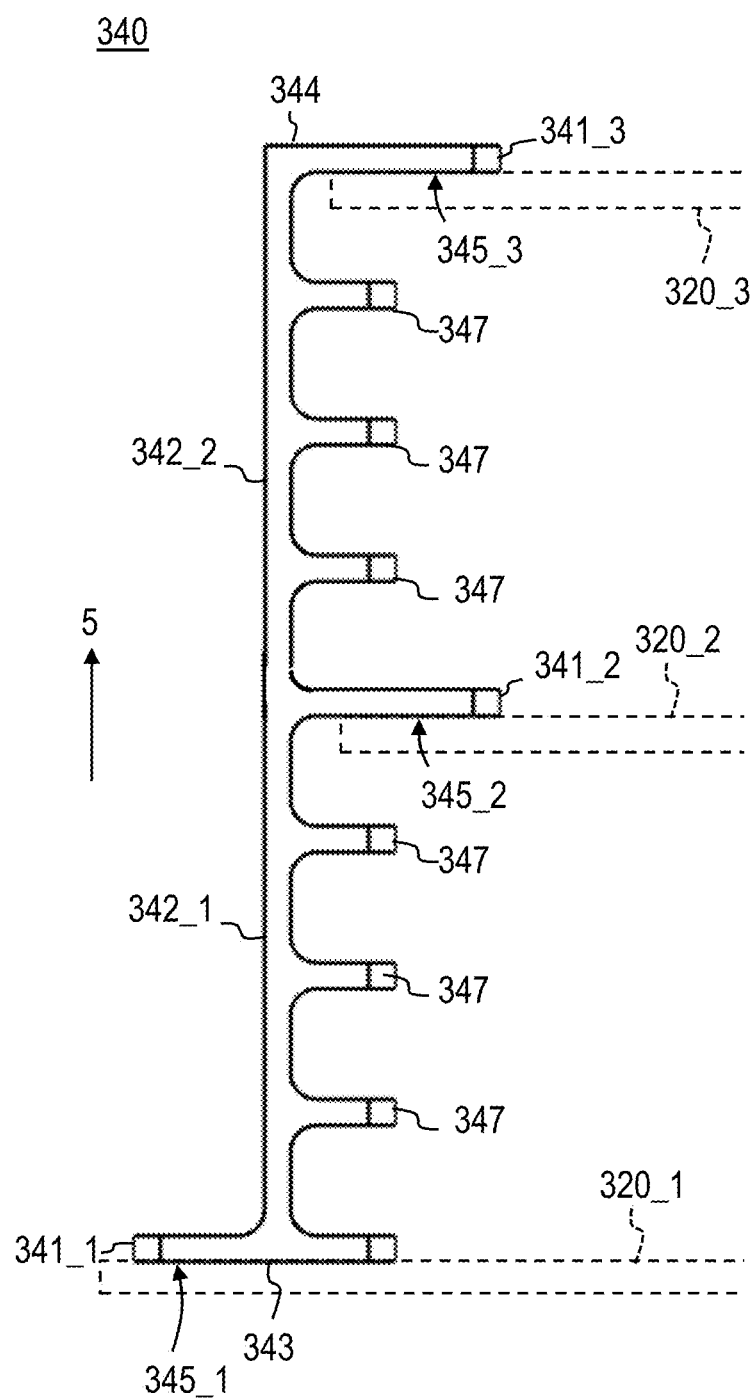
FIG. 7 is a perspective view of another bracket.

Turning now to FIG. 7, an example of a bracket 340 is described. The bracket 340 may be used as the bracket 40 or 140. Moreover, some components of the bracket 340 are similar to components described above, and the descriptions above are thus applicable to the similar components of the bracket 240. Similar components are referred to using the same last two digits, such as 241 and 141. Although the bracket 340 is a configuration of the brackets 40 and 140, the brackets 40 and 140 are not limited to the bracket 340.

The bracket 340 comprises PCB connection portions 341 similar to the PCB connection portions 141 and 241 described above. However, unlike the bracket 240 illustrated in FIGS. 3 and 4 which comprises two PCB connection portions 241 to couple with two PCBs 220, the bracket 340 comprises three PCB connection portions 341_1 to 341_3 to couple with three PCBs 320_1 to 320_3. The PCB connection portion 341_1 is part of a first end portion 343 of the bracket 340, the PCB connection portion 341_3 is part of the second end portion 344 of the bracket 340 disposed opposite from the first end portion 343 along the vertical direction 5, and the PCB connection portion 341_2 is disposed between the other two PCB connection portions 341_1 and 341_3. The PCB connection portions 341_1 to 341_4 comprise respective engagement surfaces 345_1 to 3452, which are each arranged to contact the upward facing first face of a respectively corresponding PCB 320_1 to 320_3 positioned below the respective PCB connection portion 341_1 to 341_3.

The bracket 340 also comprises intermediate portions 342 similar to the intermediate portions 142 and 242 described above. However, unlike the bracket 240 which comprises one intermediate portion 242, the bracket 340 comprises two intermediate portions 342, i.e., a first intermediate portion 342_1 extending between the PCB connection portions 341_1 and 341_2 and a second intermediate portion 342_2 extending between the PCB connection portions 341_2 and 341_3. The bracket 340 may also comprise horizontal ribs 347 extending from one, some, or all of the intermediate portions 342.

Although FIG. 7 illustrates a configuration of the bracket 340 in which there are three PCB connection portions 341 and two intermediate portions 342, it should be understood that other examples of the bracket 340 may have more PCB connection portions 341 and intermediate portions 342 to allow for coupling with more PCBs 320. In particular, the bracket 340 may be configured to accommodate an arbitrary number N of PCBs 320 by providing N×PCB connection portions 341 (one for each PCB 320) and (N−1)×intermediate portions 342, with the PCB connection portions 341 spaced apart in the vertical direction 5 at desired locations and each intermediate portion 342 extending in the vertical direction 5 between a pair of vertically adjacent PCB connection portions 341.

By controlling the distances between the engagement surfaces 345 of the respective PCB connection portions 341, the vertical locations of the PCBs 320 relative to the bracket 340 and relative to one another can be controlled, as described above. In FIG. 7, the distance between the engagement surfaces 345_1 and 345_2 is shown as being the same as the distance between the engagement surfaces 345_2 and 345_3, but in other examples one or more adjacent pairs of engagement surfaces 345 may have different vertical separation distances than the separation distance between one or more other adjacent pairs of engagement surfaces 345.

In the description above, various types of electronic circuitry or devices are described. As used herein, "electronic" is intended to be understood broadly to include all types of circuitry/devices utilizing electricity, including digital and analog circuitry, direct current (DC) and alternating current (AC) circuitry, and circuitry/devices for converting electricity into another form of energy and circuitry/devices for using electricity to perform other functions. In other words, as used herein there is no distinction between "electronic" circuitry/devices and "electrical" circuitry/devices. In some cases, certain electronic circuitry/devices may comprise processing circuitry. Processing circuitry comprises circuitry configured with logic for performing various operations. The logic of the processing circuitry may comprise dedicated hardware to perform various operations, software (machine readable and/or processor executable instructions) to perform various operations, or any combination thereof. In implementations in which the logic comprises software, the processing circuitry may include a processor to execute the software instructions and a memory device that stores the software. The processor may comprise one or more processing devices capable of executing machine readable instructions, such as, for example, a processor, a processor core, a central processing unit (CPU), a controller, a micro-controller, a system-on-chip (SoC), a digital signal processor (DSP), a graphics processing unit (GPU), etc. In cases in which the processing circuitry includes dedicated hardware, in addition to or in lieu of the processor, the dedicated hardware may include any electronic device that is configured to perform specific operations, such as an Application Specific Integrated Circuit (ASIC), a Field Programmable Gate Array (FPGA), a Complex Programmable Logic Device (CPLD), discrete logic circuits, a hardware accelerator, a hardware encoder, etc. The processing circuitry may also include any combination of dedicated hardware and processor plus software.

It is to be understood that both the general description and the detailed description provide example implementations that are explanatory in nature and are intended to provide an understanding of the present disclosure without limiting the scope of the present disclosure. Other examples in accordance with the present disclosure will be apparent to those skilled in the art based on consideration of the disclosure herein. For example, various mechanical, compositional, structural, electronic, and operational changes may be made to the disclosed examples without departing from the scope of this disclosure, including for example the addition, removal, alteration, substitution, or rearrangement of elements of the disclosed examples, as would be apparent to one skilled in the art in consideration of the present disclosure. Moreover, it will be apparent to those skilled in the art that certain features or aspects of the present teachings may be utilized independently (even if they are disclosed together in some examples) or may be utilized together (even if disclosed in separate examples), whenever practical. In some instances, well-known circuits, structures, and techniques have not been shown or described in detail in order not to obscure the examples. Thus, the following claims are intended to be given their fullest breadth, including equivalents, under the applicable law, without being limited to the examples disclosed herein.

References herein to examples, implementations, or other similar references should be understood as referring to prophetic or hypothetical examples, rather than to devices/systems that have been actually produced, unless explicitly indicated otherwise. Similarly, references to qualities or characteristics of examples should be understood as representing the educated estimates or expectations of the inventors based on their understanding of the relevant principles involved, application of theory and/or modeling, and/or past experiences, rather than as being representations of the actual qualities or characteristics of an actually produced device/system or the empirical results of tests actually carried out, unless explicitly indicated otherwise.

Further, spatial, positional, and relational terminology used herein is chosen to aid the reader in understanding examples of the invention but is not intended to limit the invention to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Furthermore, if a different reference frame is considered than the one illustrated in the figures, then the spatial terms used herein may need to be interpreted differently in that different reference frame. Moreover, the poses of items illustrated in the figure are chosen for convenience of illustration and description, but in an implementation in practice the items may be posed differently.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition. Moreover, unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

What is claimed is:

1. A bracket for a printed circuit board assembly (PCA), comprising:
    a first PCB connection portion configured to be coupled to a first face of a first printed circuit board (PCB) of the PCA in an assembled state of the PCA; and
    a second PCB connection portion configured to be coupled to a first face of a second PCB of the PCA in the assembled state of the PCA,
    wherein in the assembled state of the PCA,
        the first and second PCBs are in a stacked arrangement with the respective first faces thereof facing in a first direction; and
        the bracket controls a distance between the respective first faces of the first and second PCBs along the first direction independent of respective thicknesses of the first and second PCBs along the first direction.

2. The bracket of claim 1,
    wherein the first PCB connection portion comprises a first engagement surface and the second PCB connection portion comprises a second engagement surface parallel to the first engagement surface, and
    wherein in the assembled state of the PCA,
        the first engagement surface is fixedly engaged with the first face of the first PCB and the second engagement surface is fixedly engaged with the first face of the second PCB, and
        the distance between the respective first faces of the first and second PCBs along the first direction is dependent on a distance between the first engagement surface and the second engagement surface along the first direction.

3. The bracket of claim 2,
    wherein the first PCB comprises a first component attached to the first face of the first PCB and the second PCB comprises a second component attached to the first face of the second PCB;
    wherein a distance between the first component and the second component along the first direction is dependent on the distance between the first engagement surface and the second engagement surface along the first direction and is independent of the respective thicknesses of the first and second PCBs along the first direction.

4. The bracket of claim 1, further comprising:
    an intermediate portion extending along the first direction between the first and second PCB connection portions,
    wherein the first PCB connection portion extends in a second direction from the intermediate portion, the second direction being transverse to the first direction.

5. The bracket of claim 4,
    wherein in the assembled state of the PCA, the intermediate portion extends through a thickness dimension of the first PCB.

6. The bracket of claim 5,
    wherein in the assembled state of the PCA, the intermediate portion is adjacent to an edge of the first PCB and the first PCB connection portion extends from the intermediate portion across the edge of the first PCB and over the first face of the PCB.

7. The bracket of claim 4, further comprising:
    a rib extending in the second direction from the intermediate portion.

8. The bracket of claim 7,
    wherein the rib has length and breadth dimensions that are in a plane parallel to the second direction and a thickness dimension parallel to the first direction, the thickness dimension being smaller than the length and breadth dimensions.

9. The bracket of claim 1,
a third PCB connection portion configured to be coupled to a first face of a third PCB of the PCA in the assembled state of the PCA,
wherein in the assembled state of the PCA,
the first, second, and third PCBs are in a stacked arrangement with the respective first faces thereof facing in a first direction; and
the bracket controls distances between the respective first faces of the first, second, and third PCBs along the first direction independent of respective thicknesses of the first, second, and third PCBs along the first direction.

10. An electronic device, comprising:
a first printed circuit board (PCB) comprising a first face and a first component coupled to the first face;
a second PCB comprising a first face and a second component coupled to the first face; and
a bracket coupling the first PCB to the second PCB in a stacked arrangement with the first faces of the first and second PCBs facing in a first direction, the bracket comprising:
   a first PCB connection portion comprising a first engagement surface fixedly engaged with the first face of the first PCB; and
   a second PCB connection portion comprising a second engagement surface parallel to the first engagement surface and fixedly engaged with the first face of the second PCB,
wherein a distance between the first component and the second component along the first direction is dependent on a distance between the first engagement surface and the second engagement surface along the first direction and is independent of respective thicknesses of the first and second PCBs along the first direction.

11. The electronic device of claim 10, further comprising:
an intermediate portion extending along the first direction between the first and second PCB connection portions,
wherein the first PCB connection portion extends in a second direction from the intermediate portion, the second direction being transverse to the first direction.

12. The electronic device of claim 11,
wherein the intermediate portion extends through a thickness dimension of the first PCB.

13. The electronic device of claim 11, further comprising:
a rib extending in the second direction from the intermediate portion.

14. The electronic device of claim 13,
wherein the rib has length and breadth dimensions that are in a plane parallel to the second direction and a thickness dimension parallel to the first direction, the thickness dimension being smaller than the length and breadth dimensions.

15. The electronic device of claim 10, further comprising:
a third PCB oriented transverse to the first and second PCBs and comprising third and fourth components configured to be coupled with the first and second components, respectively.

16. The electronic device of claim 15, further comprising:
a chassis,
wherein the third PCB is housed within and coupled to the chassis,
wherein the first and second PCBs are part of a pluggable module configured to be removably installed in the chassis,
wherein the first, second, third, and fourth components comprise electrical connectors, and
wherein the first and second components are arranged to electrically connect via blind mating with the third and fourth components, respectively, in response to installation of the pluggable module in the chassis.

17. The electronic device of claim 10, further comprising:
a third PCB comprising a first face and a third component coupled to the first face,
wherein the bracket comprises a third PCB connection portion comprising a third engagement surface fixedly engaged with the first face of the third PCB,
wherein the first, second, and third PCBs are in a stacked arrangement with the respective first faces thereof facing in a first direction; and
wherein distances between the first, second, and third components along the first direction are dependent on respective distances between the first, second, and third, engagement surfaces along the first direction and are independent of respective thicknesses of the first, second, and third PCBs along the first direction.

18. A method comprising:
coupling a first printed circuit board (PCB) to a second PCB by coupling a first PCB connection portion of a bracket to a first face of the first PCB and coupling a second PCB connection portion of the bracket to a first face of the second PCB, with the respective first faces of the first and second PCBs facing in a first direction; and
controlling, by the bracket and independently of respective thicknesses of the first and second PCBs along the first direction, a distance along the first direction between the respective first faces of the first and second PCBs.

19. The method of claim 18,
wherein the first PCB connection portion comprises a first engagement surface and the second PCB connection portion comprises a second engagement surface parallel to the first engagement surface,
wherein in a coupled state of the first and second PCB connection portions to the respective first faces of the first and second PCBs, the first and second engagement surfaces are fixedly engaged with the respective first faces of the first and second PCBs, and
wherein the distance along the first direction between the respective first faces of the first and second PCBs depends on a distance in the first direction between the first engagement surface and the second engagement surface and is independent of the respective thicknesses of the first and second PCBs along the first direction.

20. The method of claim 18,
wherein the first PCB comprises a first component coupled to the first face of the first PCB and the second PCB comprises a second component coupled to the first face of the second PCB, and
wherein the method further comprises controlling, independently of respective thicknesses of the first and second PCBs along the first direction, a distance along the first direction between the first component and the second component by controlling the distance along the first direction between the respective first faces of the first and second PCBs.

* * * * *